United States Patent [19]
Okamura

[11] Patent Number: 5,521,541
[45] Date of Patent: May 28, 1996

[54] SEMICONDUCTOR DEVICE CAPABLE OF REDUCING A CLOCK SKEW IN A PLURALITY OF WIRING PATTERN BLOCKS

[75] Inventor: Hitoshi Okamura, Tokyo, Japan

[73] Assignee: NEC Corporation, Tokyo, Japan

[21] Appl. No.: 196,557

[22] Filed: Feb. 15, 1994

[30] Foreign Application Priority Data

Feb. 15, 1993 [JP] Japan ................................. 5-024621

[51] Int. Cl.⁶ .............................................. H03K 19/003
[52] U.S. Cl. .......................... 327/297; 327/292; 327/293; 327/565; 257/786; 257/208
[58] Field of Search ................................ 307/303.1, 303, 307/480, 270, 269; 257/786, 202, 532, 208

[56] References Cited

U.S. PATENT DOCUMENTS

| | | | |
|---|---|---|---|
| 5,109,168 | 4/1992 | Rusu | 302/269 |
| 5,122,693 | 6/1992 | Honda et al. | 302/303.1 |
| 5,140,184 | 8/1992 | Hamamoto et al. | 327/565 |
| 5,239,215 | 8/1993 | Yamaguchi | 322/297 |
| 5,394,490 | 2/1995 | Kato et al. | 322/292 |

FOREIGN PATENT DOCUMENTS

| | | | |
|---|---|---|---|
| 63-107316 | 5/1988 | Japan . | |
| 1-289155 | 11/1989 | Japan | 257/208 |

Primary Examiner—Timothy P. Callahan
Assistant Examiner—Dinh T. Le
Attorney, Agent, or Firm—Sughrue, Mion, Zinn, Macpeak & Seas

[57] ABSTRACT

In a semiconductor device including a clock driver which provides clock signals, a plurality of electronic elements which are operable in timed relation to the clock signals, are provided a plurality of circumferentially-wired, lattice-shaped wiring blocks to which the electronic elements are connected and each of which has a center portion, and an interconnecting wiring pattern connected to the center portion. The interconnecting wiring pattern connects the clock driver with the center portion of each circumferentially-wired, lattice-shaped wiring block so that a distance between the clock driver and each center portion is substantially equal to one another in the center portions.

6 Claims, 6 Drawing Sheets

PRIOR ART

SEMICONDUCTOR DEVICE CAPABLE OF REDUCING A CLOCK SKEW IN A PLURALITY OF WIRING PATTERN BLOCKS

BACKGROUND OF THE INVENTION

This invention relates to a semiconductor device which is incorporated in an LSI circuit or the like.

A conventional semiconductor device of the type described comprises a large number of electronic elements, such as flip-flops, and the like, and a clock driver which delivers clock signals to the electronic elements through a wiring pattern between the electronic elements and the clock driver.

It is preferable that the clock signals are delivered to all of the electronic elements without any difference of a delay time, namely, a delay time difference. Such a delay time difference is generally called a clock skew. However, it is practically difficult to completely get rid of the clock skew because of differences of lengths of the wirings.

In order to reduce such a clock skew, it has recently been proposed that the wiring pattern is formed into a lattice-shape. Such a lattice-shaped wiring pattern is exemplified in Unexamined Japanese Patent Publication No. Sho 63-107316, namely, 107316/1988.

In the interim, it is a recent trend that an integration scale in the semiconductor device becomes larger and larger and that a frequency of the clock signals becomes higher and higher.

Under the circumstances, it is inevitable that the wiring pattern becomes long. Furthermore, it sometimes happens that an error operation is caused to occur by a timing error which results from the above-mentioned clock skew.

The clock skew becomes large with an increase of the integration scale, which causes the error operation to frequently occur.

Although consideration is made in the above-referenced publication only about the clock skew which occurs in a single wiring pattern, such a clock skew might become serious when a semiconductor device comprises a plurality of wiring patterns in the form of wiring blocks.

SUMMARY OF THE INVENTION

It is therefore an object of this invention to provide a semiconductor device which can reduce a clock skew even when a plurality of wiring blocks are included in the semiconductor device.

Other objects of this invention will become clear as the description proceeds.

According to an aspect of this invention, the semiconductor device comprises a clock driver which provides clock signals having a predetermined frequency, a plurality of lattice-shaped wiring blocks each of circumferentially-wired which has a center portion, a plurality of electronic elements which are connected to each of the lattice-shaped wiring blocks and which are operable in timed relation to the clock signals, and an interconnecting wiring pattern which connects the clock driver with the center portions so that a distance between the clock driver and each of the center portions is substantially equal to one another in the center portions.

The semiconductor device may further comprise a plurality of additional wiring patterns through which the electronic elements are connected to each of the circumferentially-wired lattice-shaped wiring blocks.

The semiconductor device may also comprises a plurality of buffer circuits each of which is incorporated in the interconnecting wiring pattern and the additional wiring patterns.

The interconnecting wiring pattern may comprise a plurality of subsidiary wiring patterns each of which has an H-shape or a circumferentially wired, lattice-shape.

DESCRIPTION OF THE PREFERRED EMBODIMENT

Figure 1:
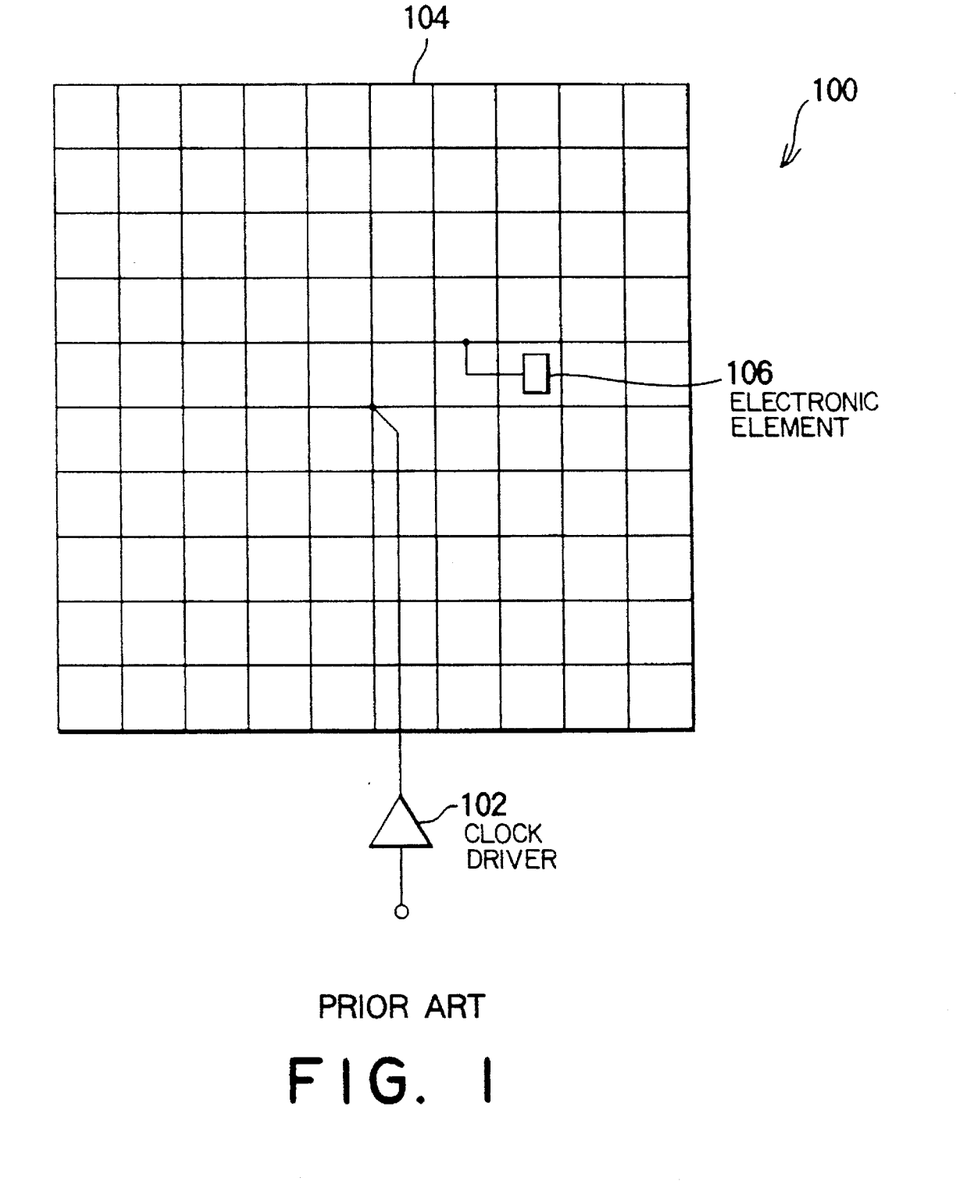
FIG. 1 is a schematic plan view of a conventional semiconductor device.

Referring to FIG. 1, a conventional semiconductor device will first be described for a better understanding of this invention. The conventional semiconductor device is substantially equivalent to that disclosed in the above publication referenced by the preamble of the instant specification.

As illustrated in FIG. 1, the conventional semiconductor device 100 comprises a clock driver 102 which provides clock signals of a predetermined frequency, for example, 2 GHz, a wiring pattern 104 connected to the clock driver 102, and a plurality of electronic elements 106, such as filp-flops, which are connected to the wiring pattern 104 and which are operable in timed relation to the clock signals.

With this structure, the clock signals which are generated by a clock signal oscillator (now shown) are sent through the clock driver 102 to be given to the electronic elements 106 through the wiring pattern 104.

Herein, it is to be noted that conventional consideration has been directed to a single wiring pattern which is connected to all of the electronic elements 106 connected to the clock driver 102. In other words, no consideration has been made about a semiconductor device which comprises a plurality of wiring patterns. This means that no attention is directed to an increase of a chip size and an extension of the wiring pattern 104.

Furthermore, a clock skew might become large with an increase of the chip size and which an extension of the wiring pattern 104. This results in an increase of an error operation caused to occur by a timing error. No suggestion is made at all about an increase of a clock skew which brings about the timing error.

Figure 2:
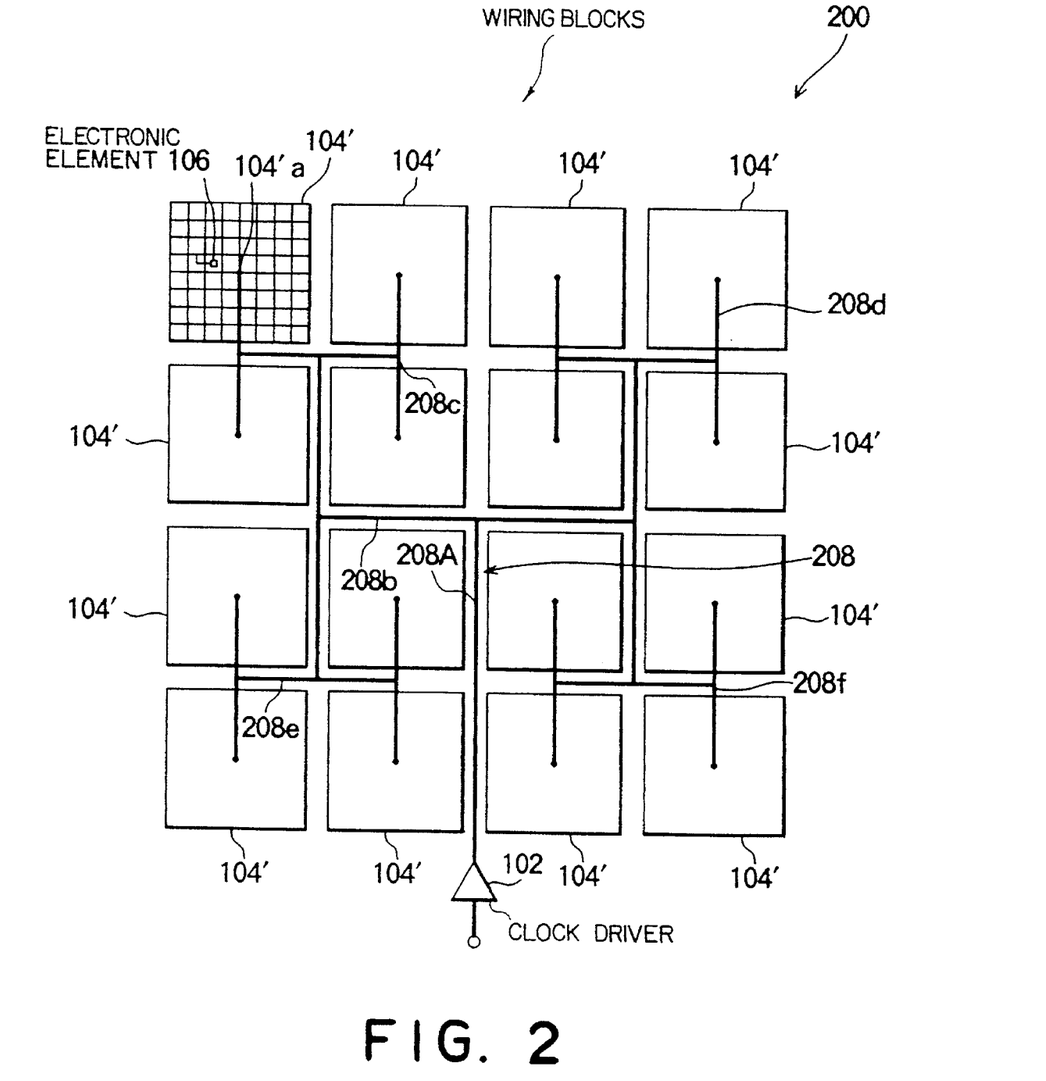
FIG. 2 is a schematic plan view of a semiconductor device according to a first embodiment of this invention.
Figure 3:
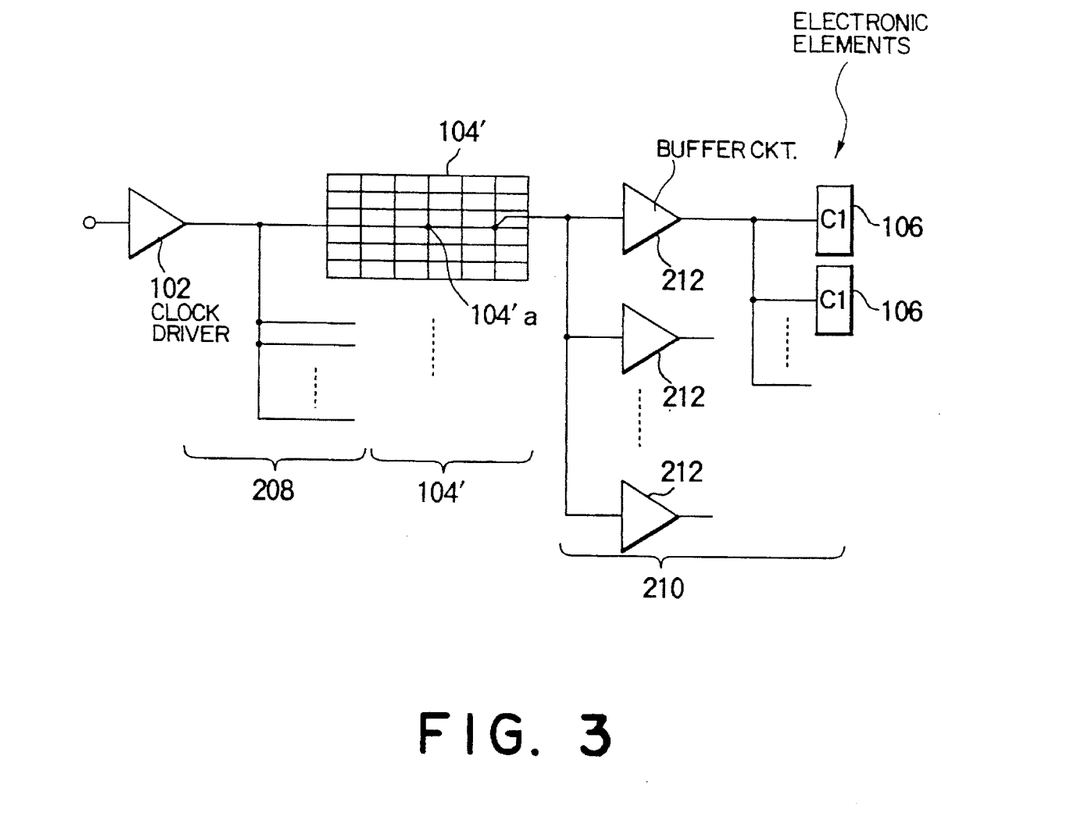
FIG. 3 is a simplified diagram for indicating the semiconductor device illustrated in FIG. 2.
Figure 4:
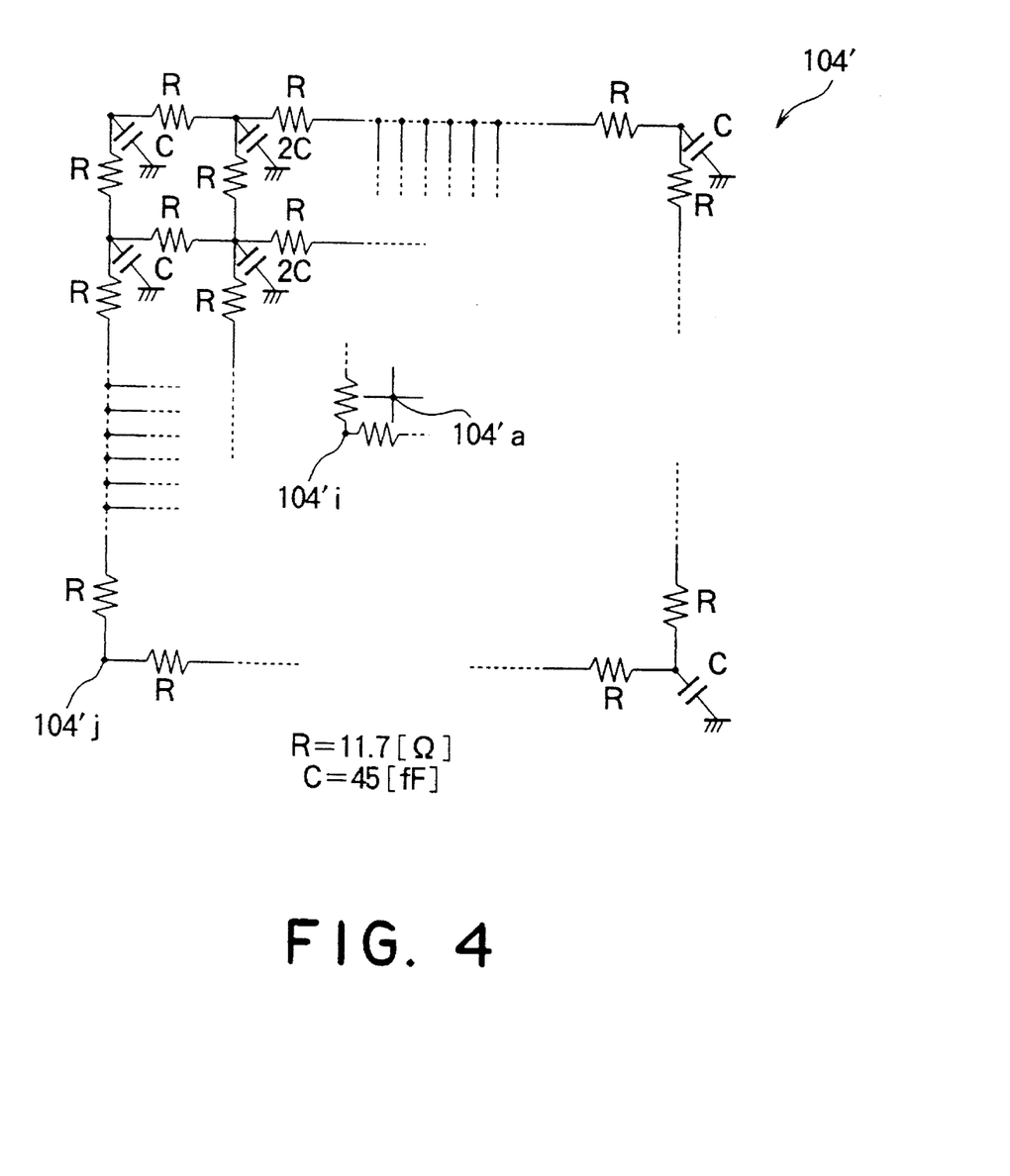
FIG. 4 shows an equivalent circuit of one of the circumferentially-wired lattice-shaped wiring blocks in the semiconductor device illustrated in FIG. 2.

Referring now to FIGS. 2 to 4, description will proceed to a semiconductor device according to a first embodiment of this invention. Similar parts are designated by like reference numerals.

As illustrated in FIG. 2, a semiconductor device 200 comprises a clock driver 102 which provides clock signals of a predetermined frequency, for example, 2 GHz, like in FIG. 1.

As is apparent from FIG. 2, the illustrated semiconductor device 200 comprises a plurality of wiring blocks 104' each of which has circumferentially wired, lattice-shaped wirings, as specified in FIG. 2 by a block located at an uppermost row and a leftmost column, and which may be similar to the wiring pattern 104 illustrated in FIG. 1.

In this connection, each of the wiring blocks 104' has a block center portion 104'a and a plurality of electronic elements 106, such as flip-flops, and the like, connected to the lattice-shaped wirings. The block center 104'a is located at a center of the lattice-shaped wirings in the illustrated example.

Moreover, an interconnecting wiring pattern (collectively depicted at 208) is laid between the respective wiring blocks 104' and the clock driver 102. As a result, the electronic elements 106 of each wiring block 104' are connected to the clock driver 102 through the interconnecting wiring pattern 208. More specifically, the illustrated interconnecting wiring pattern 208 is divided into a plurality of subsidiary wiring patterns 208A, 208b, 208c, 208d, 208e, and 208f, each of which has a capital H-shape. The subsidiary wiring pattern 208A is directly connected to the clock driver 102 at a center point of the subsidiary wiring pattern, namely, the H-shape 208A and is connected at four ends of the H-shape to the remaining subsidiary wiring patterns 208b to 208f. Each of the remaining subsidiary wiring patterns 208b to 208f is connected at four ends of each H-shape to four block centers of, such as 104'a, of the wiring blocks 104'.

Herein, it is assumed in FIG. 2 that a distance (i.e., the length of an electrical path) is measured between the clock driver 102 and each block center 104'a of the wiring blocks 104' through the interconnecting wiring pattern 208. In this case, it is readily understood that the distances (i.e., the lengths of the electrical paths) between the clock driver 102 and the respective block centers 104'a are substantially equal to one another. In other words, the interconnecting wiring pattern 208 serves to connect the clock driver 102 to the respective block centers 104'a so that the distances between the clock driver 102 and the respective block centers 104'a are substantially equal to one another.

This means that the clock skew can be minimized between the clock driver 102 and the respective block centers 104'a.

As illustrated in FIG. 3, the electronic elements 106 are connected through a plurality of additional wiring patterns 210 to each wiring block 104'. Each of the additional wiring patterns 210 may include a plurality of buffer circuits 212. Each electronic element 106 has a clock signal input terminal C1 which is connected to an optional point of each lattice-shaped wiring blocks 104' through each buffer circuit 212 by a wiring of short length.

Let each of the lattice-shaped wiring blocks 104' be implemented by a multilayer structure. In this event, it may be assumed that the multilayer structure is formed by a first layer for the electronic elements, a second layer for the wirings extended towards a row direction, namely, an X-direction, and a third layer for the wirings extended towards a column direction, namely, a Y-direction. The wirings in the X-direction and the wirings in the Y-direction are connected to one another on each lattice point by way of throughholes (not shown), and the wiring ends are all connected by a circumferential wiring as illustrated.

Although illustration is made about the wiring block 104' of 9×9, each of the circumferentially wired, lattice-shaped wiring blocks 104' practically consists of 18×18 wirings. Each wiring is made of gold and is arranged at a pitch of 300 micronmeters defined between two adjacent ones of the wirings. Each wiring has a width of 1 micronmeter and a thickness of 0.7 micronmeter.

Referring to FIG. 4, a result of a simulation test will be described to confirm clock skew characteristics of the semiconductor device 200 illustrated in FIGS. 2 and 3.

In the simulation test, let ECL clock signals which have a rise time of 500 psec be given to the center portion 104'a.

In this case, it is found out that a clock skew takes place between an innermost point 104'i and an outermost point 104'j in the circumferentially wired lattice-shaped wiring blocks 104' and is equal to 55 psec.

When a great number of flip-flops are contained in a chip, equal numbers of the flip-flops may be connected to each buffer circuit 212, respectively, by means of a computer aided design (CAD) technique. In this event, a clock skew which might result from the additional wiring patterns 210 can be decreased because a floating capacitance C is balanced. As a result, a clock skew in a square area of 5.4 mm×5.4 mm can be decreased to substantially 55 psec, on the assumption that the clock skew due to the additional wiring patterns 210 is equal to 10 psec.

On the other hand, a capacitance of each circumferentially-wired, lattice-shaped wiring block 104' is 13.2 pF while the floating capacitance of the terminal C1 and the electronic element 106 is, for example, 15 fF or so. Therefore, the former is considerably greater than the latter. Consequently, a total capacitance of each circumferentially-wired, lattice-shaped wiring block 104' and any clock signal wiring connected thereto can be deemed to be substantially equal to one another.

As mentioned before, the interconnecting wiring pattern 208 connects the clock driver 102 with the block center portions 104'a so that the distance (i.e., electrical path) between the clock driver 102 and each of the block centers 104'a is substantially equal to one another in the center portions 104'a. The clock skew between each block center 104'a and the clock driver 102 can be extremely decreased.

As a result of the above-mentioned simulation test, it has been found out that the clock skew among the clock signal input terminals C1 of the electronic elements 106 can be decreased down to 65 psec.

Figure 5:
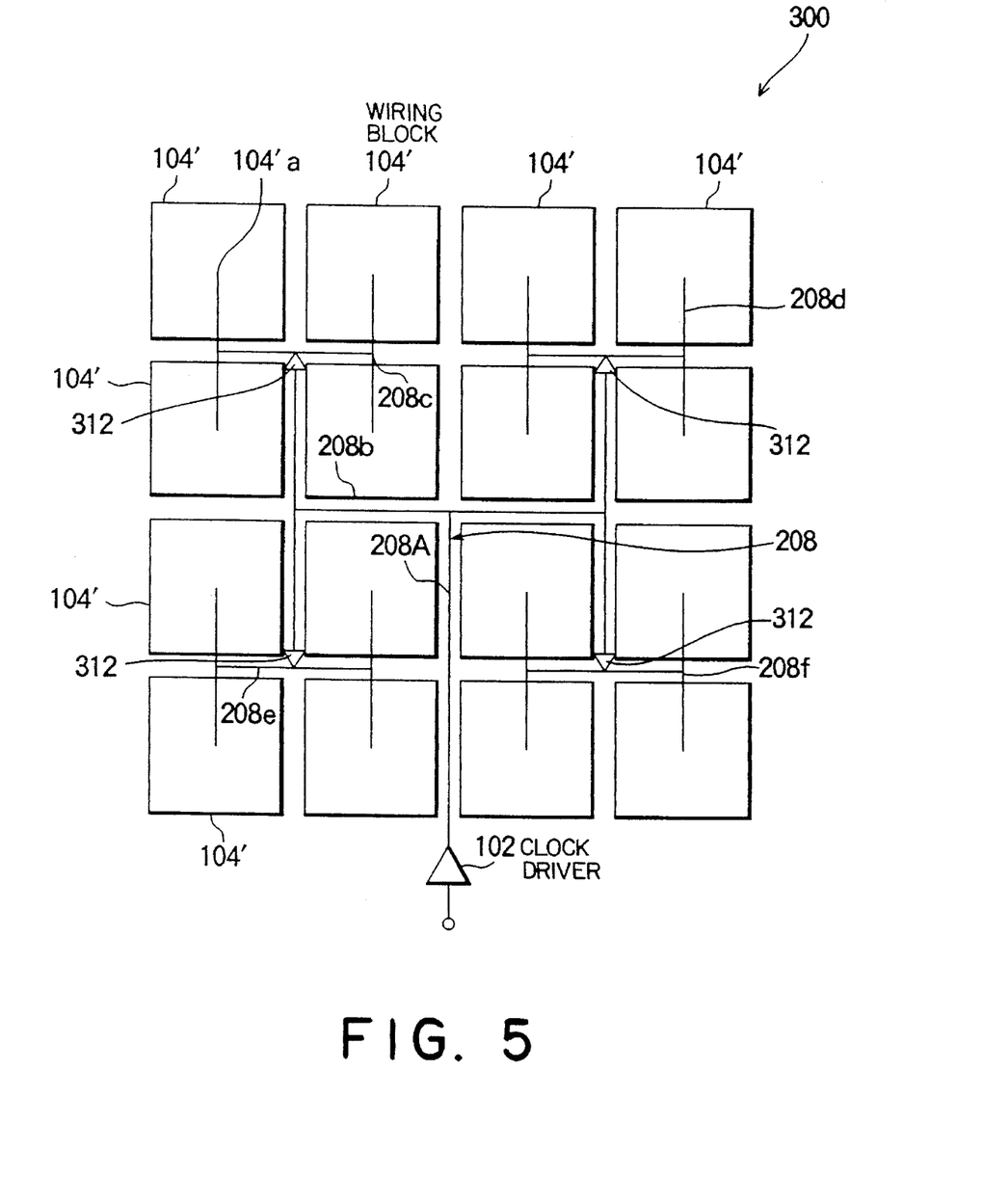
FIG. 5 is a schematic plan view of a semiconductor device according to a modification of the first embodiment illustrated in FIG. 2.

Referring to FIG. 5, description will proceed to a semiconductor device 300 according to a modification of the first embodiment illustrated in FIG. 2.

As illustrated in FIG. 5, the semiconductor device 300 has a structure similar to that of the semiconductor device 200 illustrated in FIG. 2 except that the semiconductor device 300 further comprises a plurality of buffer circuits 312 each of which is incorporated in the interconnecting wiring pattern 208. The buffer circuits 312 are located between the end points of the subsidiary wiring pattern 208A and the centers of the remaining subsidiary wiring patterns 208b to 208f. Similar parts are designated by like reference numerals.

In this embodiment, a load imposed on the clock driver 102 is considerably lightened, since each lattice-shaped wiring block 104' is driven by each buffer circuit 312. As a result, the clock driver 102 can be designed to be small in size. Such a clock driver 102 of a small size brings about a reduction of noise and a reduction of current consumption. In addition, an additional power supply is unnecessary to drive each circumferentially-wired lattice-shaped wiring block 104'.

Figure 6:
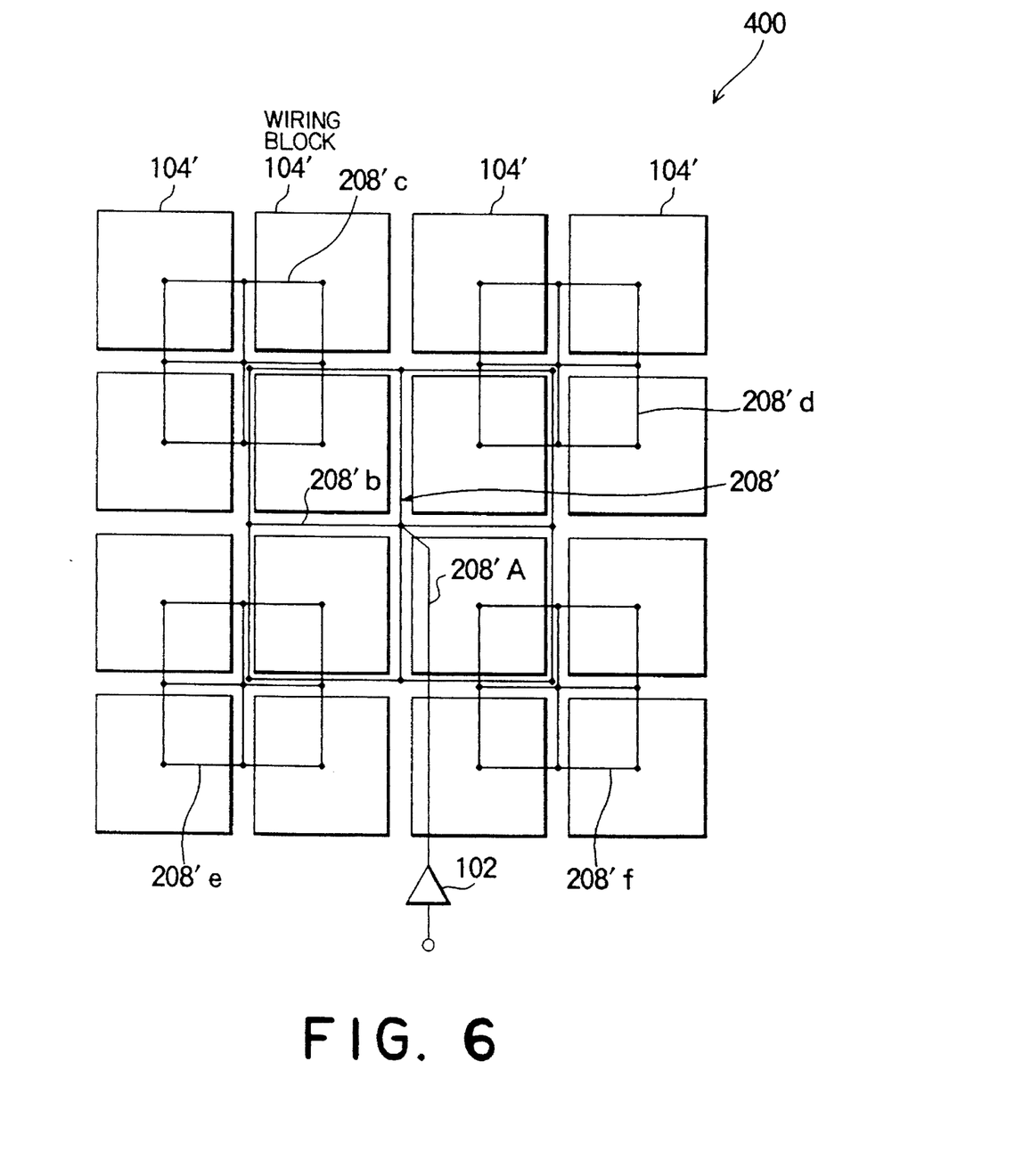
FIG. 6 is a schematic plan view of a semiconductor device according to a second embodiment of this invention.

Referring to FIG. 6, description will be made about a semiconductor device 400 according to a second embodiment of the present invention.

As illustrated in FIG. 6, the semiconductor device 400 has a structure similar to that of the semiconductor device 200 illustrated in FIG. 2 except that the interconnecting wiring pattern 208' comprises a plurality of subsidiary wiring patterns 208'A, 208'b, 208'c, 208'd, 208'e, and 208'f each of which has a circumferentially-wired lattice-shape, namely, a square shape. In this embodiment, the subsidiary wiring pattern is further defined as follows: 208'b defines a primary clock signal wiring, 208'c–f define a plurality of secondary clock signal wirings, and blocks 104' define a plurality of tertiary clock signal wirings.

In this embodiment, a resistance of each subsidiary wiring pattern 208'b, 208'c, 208'd, 208'e, and 208'f becomes equal to one another, like the first embodiment mentioned above. Furthermore, the resistance of each subsidiary wiring pattern 208'A, 208'b, 208'c, 208'd, 208'e, and 208'f becomes smaller than that of each subsidiary wiring pattern 208A, 208b, 208c, 208d, 208e, and 208f (shown in FIG. 2) which has the H-shape. It is possible to keep the resistance of each of the wiring patterns 208A, 208b to 208f substantially equal to one another. In other words, variation of the resistances among the wiring patterns can be minimized.

Like the above-described semiconductor device 300, the semiconductor device 400 may further comprise a plurality of buffer circuits each of which is incorporated in the interconnecting wiring patterns 208'.

While this invention has thus far been described in conjunction with several embodiments thereof, it will now be readily possible for one skilled in the art to put this invention into effect in various other manners. For example, the electronic elements are not restricted to flip-flops and may be, for example, registers, shift registers, and the like.

What is claimed is:

1. A semiconductor device comprising;

a clock driver for providing a clock signal;

lattice-shaped wiring blocks, each of which has a respective center portion, including a first wiring block having a first center portion, and a second wiring block having a second center portion;

first and second electronic elements, each of which is coupled to one of said first wiring block and said second wiring block, and each of which receive said clock signal; and an interconnecting wiring pattern;

said lattice-shaped wiring blocks each comprising a first plurality of parallel wirings, a second plurality of parallel wirings, and a circumferential wiring; said first and second pluralities of parallel wirings each having first and second ends; said first plurality of parallel wirings being perpendicular to said second plurality of parallel wirings and defining a lattice shape with an electrical connection being formed at intersections of wirings from said first plurality of parallel wirings with wirings from said second plurality of parallel wirings; said circumferential wiring disposed around said first and second pluralities of parallel wirings and being connected to each said first and second ends of each wiring thereof; and said interconnecting wiring pattern being coupled between said clock driver and said respective center portion of each of said lattice-shaped wiring blocks so that the length of each electrical path between said clock driver and said respective center portion of each of said lattice-shaped wiring blocks is substantially equal;

wherein said respective center portion of each of said lattice-shaped wiring blocks is connected to a subsidiary wiring pattern of said interconnecting wiring pattern; and wherein said subsidiary wiring pattern of said interconnecting wiring pattern is lattice-shaped.

2. A semiconductor device as claimed in claim 1, wherein:

said interconnecting wiring pattern comprises a first subsidiary wiring pattern, and four second subsidiary wiring patterns, each of said four second subsidiary wiring patterns having a respective central portion;

said first subsidiary wiring pattern is connected to said respective central portion of each of said four second subsidiary wiring patterns; and said first center portion of said first lattice-shaped wiring block and said second center portion of said second lattice-shaped wiring block are each connected to one of said four second subsidiary wiring patterns.

3. A semiconductor device as claimed in claim 2, further comprising one or more additional wiring patterns through which said electronic elements are connected to said lattice-shaped wiring blocks.

4. A semiconductor device as claimed in claim 3, wherein said one or more additional wiring patterns further comprise one or more buffer circuits operationally coupled between said electronic elements and said lattice-shaped wiring blocks.

5. A clock signal distribution network for an integrated circuit comprising:

a primary clock signal wiring; and a plurality of secondary clock signal wirings;

said primary and secondary clock signal wirings each having a center portion and a circumferentially-wired lattice shape defined by a first plurality of parallel wirings, a second plurality of parallel wirings, and a circumferential wiring; said first and second pluralities of parallel wirings each having first and second ends; said first plurality of parallel wirings being perpendicular to said second plurality of parallel wirings and defining a lattice shape with an electrical connection being formed at intersections of wirings from said first plurality of parallel wirings with wirings from said second plurality of parallel wirings; said circumferential wiring disposed about said first and second pluralities of parallel wirings and being connected to each said first and second ends of each wiring thereof;

said primary clock signal wiring being connected to said center portions of said secondary clock signal wirings;

wherein a clock signal applied to said center portion of said primary clock signal wiring is distributed throughout all said secondary clock signal wirings with minimal clock skew.

6. A clock signal distribution network for an integrated circuit as claimed in claim 5 further comprising:

a plurality of tertiary clock signal wirings each having a center portion and a circumferentially-wired lattice shape;

said center portion of each said tertiary clock signal wiring being connected to one of said secondary clock signal wirings;

wherein a clock signal applied to said center portion of said primary clock signal wiring is distributed via said secondary clock signal wirings throughout all said tertiary clock signal wirings with minimal clock skew.

* * * * *

UNITED STATES PATENT AND TRADEMARK OFFICE
CERTIFICATE OF CORRECTION

PATENT NO. : 5,521,541
DATED : May 28, 1996
INVENTOR(S) : Hitoshi Okamura

It is certified that error appears in the above-indentified patent and that said Letters Patent is hereby corrected as shown below:

Column 1, line 55, delete "circumferentially-wired".

Column 1, line 54, after "a plurality of" insert --circumferentially-wired--.

Signed and Sealed this

Eighth Day of October, 1996

Attest:

BRUCE LEHMAN

Attesting Officer      Commissioner of Patents and Trademarks